United States Patent
Maloney et al.

(10) Patent No.: US 10,292,310 B2
(45) Date of Patent: May 14, 2019

(54) THERMALLY CONDUCTIVE ASSEMBLIES WITH WEDGE BLOCKS FOR CONTACT HEAT CONDUCTION SUITABLE FOR ELECTRICAL DEVICES SUCH AS LOAD CENTERS

(71) Applicant: Eaton Intelligent Power Limited, Dublin (IE)

(72) Inventors: James Gerard Maloney, Industry, PA (US); James Lee Gehlbach, Lincoln, IL (US)

(73) Assignee: Eaton Intelligent Power Limited, Dublin (IE)

( * ) Notice: Subject to any disclaimer, the term of this patent is extended or adjusted under 35 U.S.C. 154(b) by 0 days.

(21) Appl. No.: 15/724,349

(22) Filed: Oct. 4, 2017

(65) Prior Publication Data
US 2018/0184544 A1    Jun. 28, 2018

Related U.S. Application Data

(60) Provisional application No. 62/437,844, filed on Dec. 22, 2016.

(51) Int. Cl.
| | |
|---|---|
| *H05K 7/20* | (2006.01) |
| *H02B 1/06* | (2006.01) |
| *H02G 3/14* | (2006.01) |
| *F28F 21/08* | (2006.01) |
| *F28F 21/04* | (2006.01) |
| *H02B 1/56* | (2006.01) |
| *H02B 1/21* | (2006.01) |
| *H02B 1/056* | (2006.01) |

(52) U.S. Cl.
CPC .......... *H05K 7/2039* (2013.01); *F28F 21/04* (2013.01); *F28F 21/084* (2013.01); *F28F 21/085* (2013.01); *H02B 1/06* (2013.01); *H02B 1/56* (2013.01); *H02G 3/14* (2013.01); *H02B 1/056* (2013.01); *H02B 1/21* (2013.01); *H05K 2201/10272* (2013.01)

(58) Field of Classification Search
None
See application file for complete search history.

(56) References Cited

U.S. PATENT DOCUMENTS

| | | | | |
|---|---|---|---|---|
| 3,633,075 | A * | 1/1972 | Hawkins | H01H 9/10 337/196 |
| 4,024,441 | A | 5/1977 | Coyle et al. | |
| 5,072,071 | A | 12/1991 | Cassity et al. | |
| 5,859,764 | A * | 1/1999 | Davis | H05K 7/1404 165/80.3 |
| 5,973,914 | A * | 10/1999 | Rose | H02B 1/056 200/50.4 |
| 6,194,983 | B1 | 2/2001 | Bogdon et al. | |
| 7,186,933 | B2 | 3/2007 | Turner | |
| 7,615,309 | B2 * | 11/2009 | Kim | H01M 2/202 320/150 |

(Continued)

*Primary Examiner* — Courtney L Smith
(74) *Attorney, Agent, or Firm* — Myers Bigel, P.A.

(57) ABSTRACT

Thermally conductive assemblies that provide a heat conduction path include at least one thermally conductive wedge block that can be held in a receptacle with a wall having sufficient flexibility to be able to expand outward in response to an outward force applied by the at least one thermally conductive wedge block. The wedge block can also be electrically resistive.

19 Claims, 6 Drawing Sheets

(56) References Cited

U.S. PATENT DOCUMENTS

| | | | |
|---|---|---|---|
| 10,034,403 B1* | 7/2018 | Flannery | F16B 2/065 |
| 2003/0075784 A1* | 4/2003 | Nakase | H01L 23/42 |
| | | | 257/675 |
| 2008/0019102 A1* | 1/2008 | Yurko | H05K 7/1404 |
| | | | 361/719 |
| 2008/0084655 A1* | 4/2008 | Ranta | H02B 1/056 |
| | | | 361/641 |
| 2008/0266803 A1* | 10/2008 | Golhardt | H02K 9/20 |
| | | | 361/700 |
| 2010/0301980 A1* | 12/2010 | Bergamini | H01F 38/30 |
| | | | 336/61 |
| 2010/0304590 A1* | 12/2010 | Frassineti | H01H 1/58 |
| | | | 439/196 |
| 2012/0017021 A1* | 1/2012 | Keegan | H01R 25/142 |
| | | | 710/305 |
| 2012/0099279 A1 | 4/2012 | Greenwood et al. | |
| 2012/0200986 A1* | 8/2012 | Maloney | H01H 71/08 |
| | | | 361/624 |
| 2013/0077210 A1 | 3/2013 | Morris | |
| 2014/0185195 A1 | 7/2014 | Samuelson | |
| 2015/0107972 A1* | 4/2015 | Oh | H01H 1/0233 |
| | | | 200/269 |
| 2015/0371790 A1* | 12/2015 | Sippel | H01H 1/62 |
| | | | 200/284 |
| 2017/0363371 A1* | 12/2017 | David | F28F 5/00 |

* cited by examiner

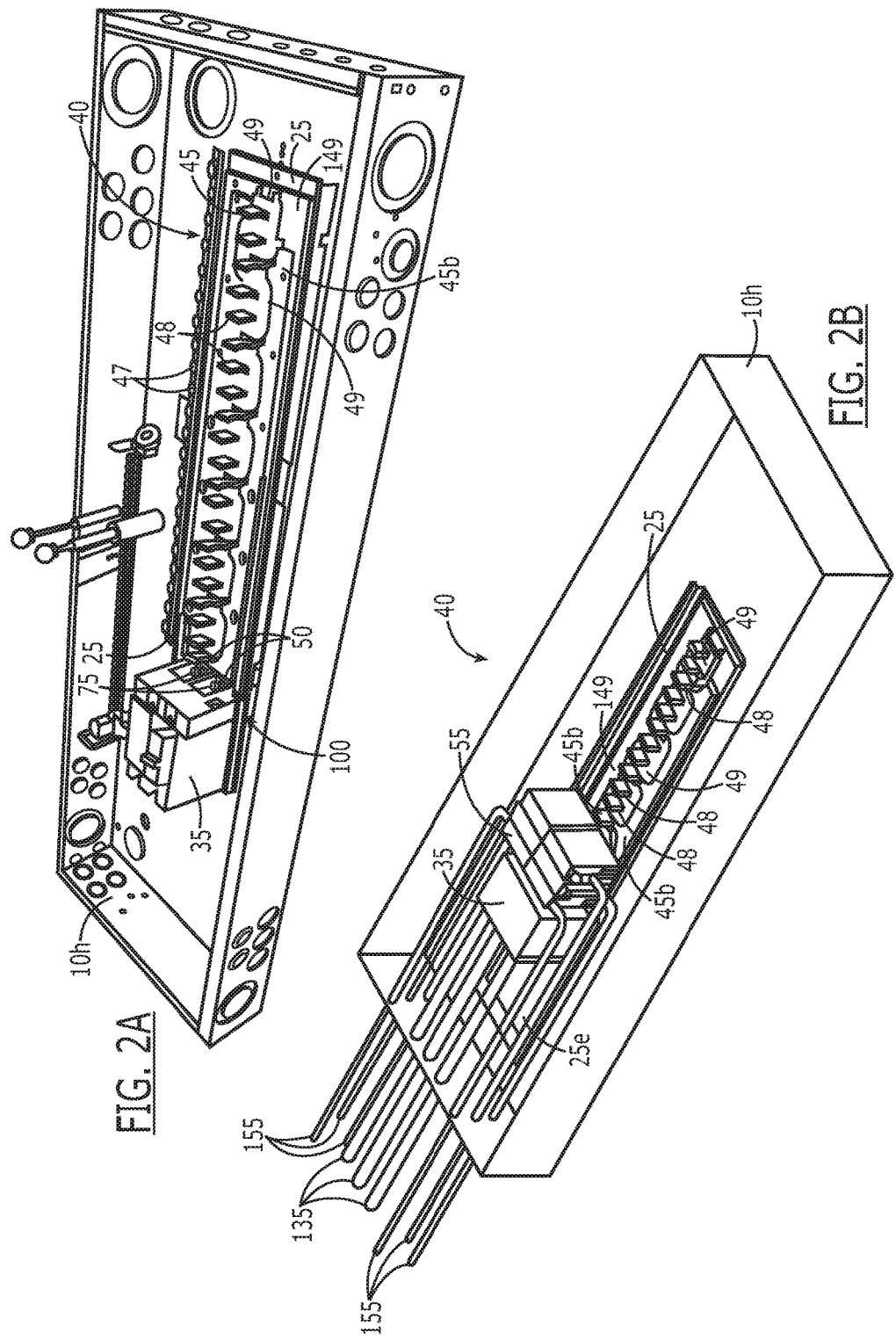

THERMALLY CONDUCTIVE ASSEMBLIES WITH WEDGE BLOCKS FOR CONTACT HEAT CONDUCTION SUITABLE FOR ELECTRICAL DEVICES SUCH AS LOAD CENTERS

RELATED APPLICATIONS

This application claims the benefit of and priority to U.S. Provisional Application Ser. No. 62/437,844, filed Dec. 22, 2016, the contents of which are hereby incorporated by reference as if recited in full herein.

FIELD OF THE INVENTION

The present disclosure relates to thermally conductive interfaces which may be particularly suitable for electrical devices such as distribution load centers.

BACKGROUND OF THE INVENTION

Electrical load centers are well known. Electrical load centers include electrical busses comprise conductors permitting electrical current to be carried throughout the electrical load center. Electrical busses may contain features permitting attachment of fuses, relays, switches, wires, breakers, and other electrical elements. Load centers may contain one or more electrical busses in close proximity to one another, and insulating material or insulation is used to avoid an arcing or shorting event occurring between the busses. Busses must are electrically insulated from each other to avoid a phase-to-phase short circuit. Busses are also electrically insulated from the electrical load center enclosure to avoid a phase-to-ground short circuit. Some load centers also include branch circuit breakers connected to the electrical busses at specific points within the load centers. The location, orientation, and spacing of the bus elements and insulation elements within the load are arranged so as to prevent an arcing, overcurrent, or short circuit event once the busses are placed under load.

In the past, thermally conductive greases, adhesives and Room Temperature Vulcanization silicone (RTV's) have been used to bridge air gaps to facilitate suitable heat conduction.

SUMMARY OF EMBODIMENTS OF THE INVENTION

Embodiments of the present invention provide positive constant contact interfaces for connections reducing or eliminating the use of conductive greases, adhesives and RTVs for facilitating heat conduction between devices.

Embodiments of the invention are directed to thermally conductive heat sink assemblies that include at least one thermally conductive wedge block. The at least one wedge block can be held in a housing that is sufficiently flexible to expand outward in response to an outward force applied by the at least one thermally conductive wedge block.

The housing can comprise one or more of rubber, a polymer and/or an elastomer.

The at least one wedge block can be formed of boron nitride.

Embodiments of the invention are directed to thermally conductive assemblies that include at least one first wedge block and a housing. The at least one first wedge block is thermally conductive and the housing has at least one receptacle that holds the at least one first wedge block.

The at least one first wedge block can be a plurality of first wedge blocks, each having an inclined plane having an angle of inclination in a range of about 35-75 degrees.

The housing can be electrically resistive. The at least one receptacle can have a wall that is sufficiently flexible to be able to expand outward in response to an outward force applied by the at least one first wedge block. The wall can optionally be formed of one or more of rubber, a polymer and/or an elastomer.

The at least one first wedge block can be a plurality of spaced apart first wedge blocks and can be electrically resistive.

The housing can be rectangular and the at least one receptacle can be a plurality of spaced apart receptacles. The at least one first wedge block can be a plurality of first wedge blocks, one in each of the receptacles.

The at least one first wedge block can be formed of and/or include boron nitride.

The at least one receptacle can be a plurality of spaced apart receptacles. The at least one first wedge block can be a plurality of first wedge blocks, with one first wedge block in a corresponding one of the receptacles.

The assembly can further include at least one second wedge block, the at least one second wedge block can have an inclined plane. The inclined plane of the second wedge block faces the inclined plane of an aligned one of the at least one first wedge block.

The at least one second wedge block can be electrically conductive and thermally conductive. The at least one second wedge block can have a planar extension that projects outwardly a distance from the inclined plane and can include an aperture configured to receive a fixation member.

The at least one second wedge block can include copper or aluminum. The at least one first wedge block can include or be formed of boron nitride.

Other embodiments are directed to load centers that include: an enclosure having an interior compartment; a heat sink member in the interior compartment; one or more bus bars attached to one or more bus terminals in the interior compartment; a circuit breaker with a housing in the interior compartment that is electrically engaged with the one or more bus bars; and at least one first wedge block in the interior compartment thermally coupled to the heat sink member. The at least one first wedge block is thermally conductive. The load centers also include at least one second wedge block thermally coupled to one or more bus bars and cooperatively engaged with the at least one first wedge block.

The at least one first wedge block can be held in a housing that has at least one receptacle with a wall that is sufficiently flexible to be able to expand in response to sliding movement of the at least one first wedge block relative to the second wedge block as the circuit breaker is tightened into position.

The at least one first wedge block can be a plurality of first wedge blocks. The load center can include a housing that has a plurality of spaced apart receptacles holding respective first wedge blocks of the plurality of first wedge blocks.

The at least one second wedge block can be attached to the one or more bus terminals. The at least one second wedge block can include or be formed of copper or aluminum and the at least one first wedge block can include or be formed of boron nitride.

The at least one first wedge block can be a plurality of first wedge blocks, each can have an inclined plane having an angle of inclination in a range of 35-75 degrees. The plurality of the first wedge blocks can be electrically resistive.

The at least one first wedge block can include or be formed of boron nitride.

The at least one first wedge block and the at least one second wedge block each can include an inclined plane and the inclined planes of pairs of the at least one first and second wedge blocks can face each other.

The at least one second wedge block can be electrically conductive and thermally conductive. The at least one second wedge block can have a planar extension that projects outwardly a distance from a body portion with an inclined plane. The planar extension can have an aperture. The load center can also include a fixation member extending through the aperture and attached to a respective one of the one or more bus terminals.

Embodiments of the invention are directed to methods of installing a heat conduction device to an electrical device. The methods can include providing at least one first wedge block that is thermally conductive, optionally holding the at least one wedge block in an electrically resistive housing having a receptacle with a wall that is flexible to be able to expand laterally. The methods can also include providing at least one second wedge block that is thermally conductive and electrically conductive, slidably engaging at least one pair of the at least one first and the at least one second wedge blocks with inclined planes of each pair facing each other, and providing a heat conduction path between the at least one pair of the at least one first and second wedge blocks.

The at least one first wedge block and the at least one second wedge block are each pluralities of blocks. The at least one pair can include first, second and third pairs of the first and second wedge blocks. The method can further include tightening a connection to a circuit breaker using a fixation member extending through the at least one second wedge block; creating an interference fit between the pairs of wedge blocks in response to the tightening; and sliding the first wedge block of the pairs of first and second wedge blocks based on the created interference fit while maintaining positive contact between the first, second and third pairs of first and second wedge blocks to provide the heat conduction path.

Optionally, the first wedge blocks can include or be formed of boron nitride and the second wedge blocks can include or be formed of copper or aluminum. Optionally, the pairs of blocks can be held in a load center and the heat conduction path is between the bus bar terminals and a heat sink member optionally a back pan and/or metal panel through the first, second and third pairs of the first and second wedge blocks.

Further features, advantages and details of the present invention will be appreciated by those of ordinary skill in the art from a reading of the figures and the detailed description of the preferred embodiments that follow, such description being merely illustrative of the present invention.

It is noted that aspects of the invention described with respect to one embodiment, may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail in the specification set forth below.

BRIEF DESCRIPTION OF THE DRAWINGS

FIG. 2A is a top, side perspective view of a back pan assembly in an enclosure of a load center according to embodiments of the present invention.

FIG. 2B is a top, side perspective schematic illustration of a load center according to embodiments of the present invention.

FIG. 9A illustrates a thermal block in a first cavity of the housing in a first configuration while

DETAILED DESCRIPTION OF EMBODIMENTS OF THE INVENTION

Figure 1A:
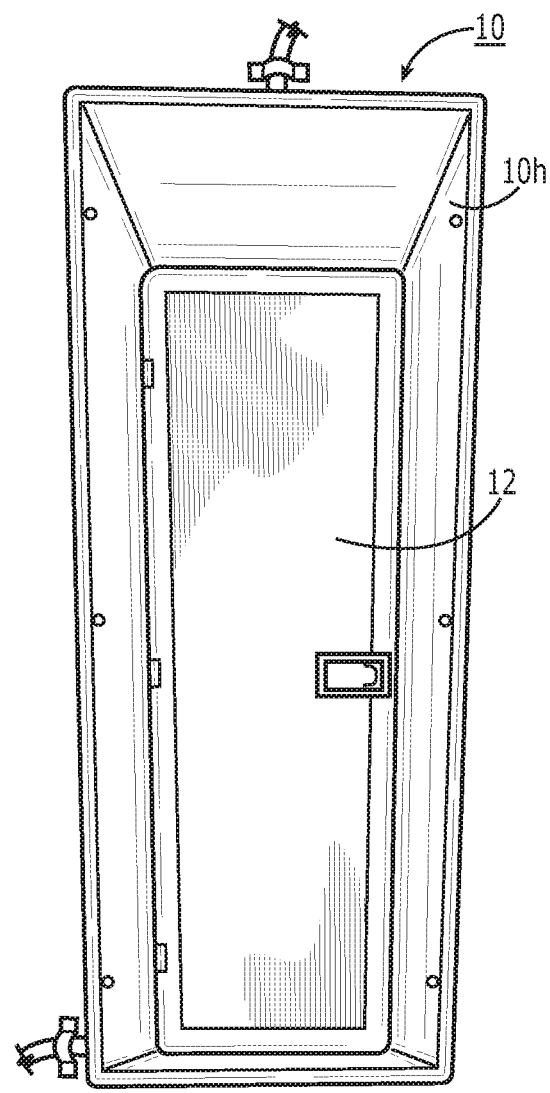
FIG. 1A is a front view of an exemplary load center.

The present invention now will be described more fully hereinafter with reference to the accompanying drawings, in which illustrative embodiments of the invention are shown. Like numbers refer to like elements and different embodiments of like elements can be designated using a different number of superscript indicator apostrophes (e.g., 10, 10', 10", 10'''). The terms "Fig." and "FIG." may be used interchangeably with the word "Figure" as abbreviations thereof in the specification and drawings. In the figures, certain layers, components or features may be exaggerated for clarity, and broken lines illustrate optional features or operations unless specified otherwise.

In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90° or at other orientations) and the spatially relative descriptors used herein interpreted accordingly.

The term "about" refers to numbers in a range of +/−20% of the noted value.

As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Embodiments of the invention are particularly suitable for electrical devices such as load centers. The terms "load center" and "electrical distribution load center" refer to the collective components of an electrical distribution system and its respective housing that supplies electrical power to one or more subsidiary circuits. The terms "bus," "bus element," "electrical distribution bus," or "bus bar" refers to components in an electrical distribution system that conducts electricity within the load center. However, the thermally conductive assemblies may also be useful for other devices such as devices comprising circuit breakers, for example.

Figure 1B:
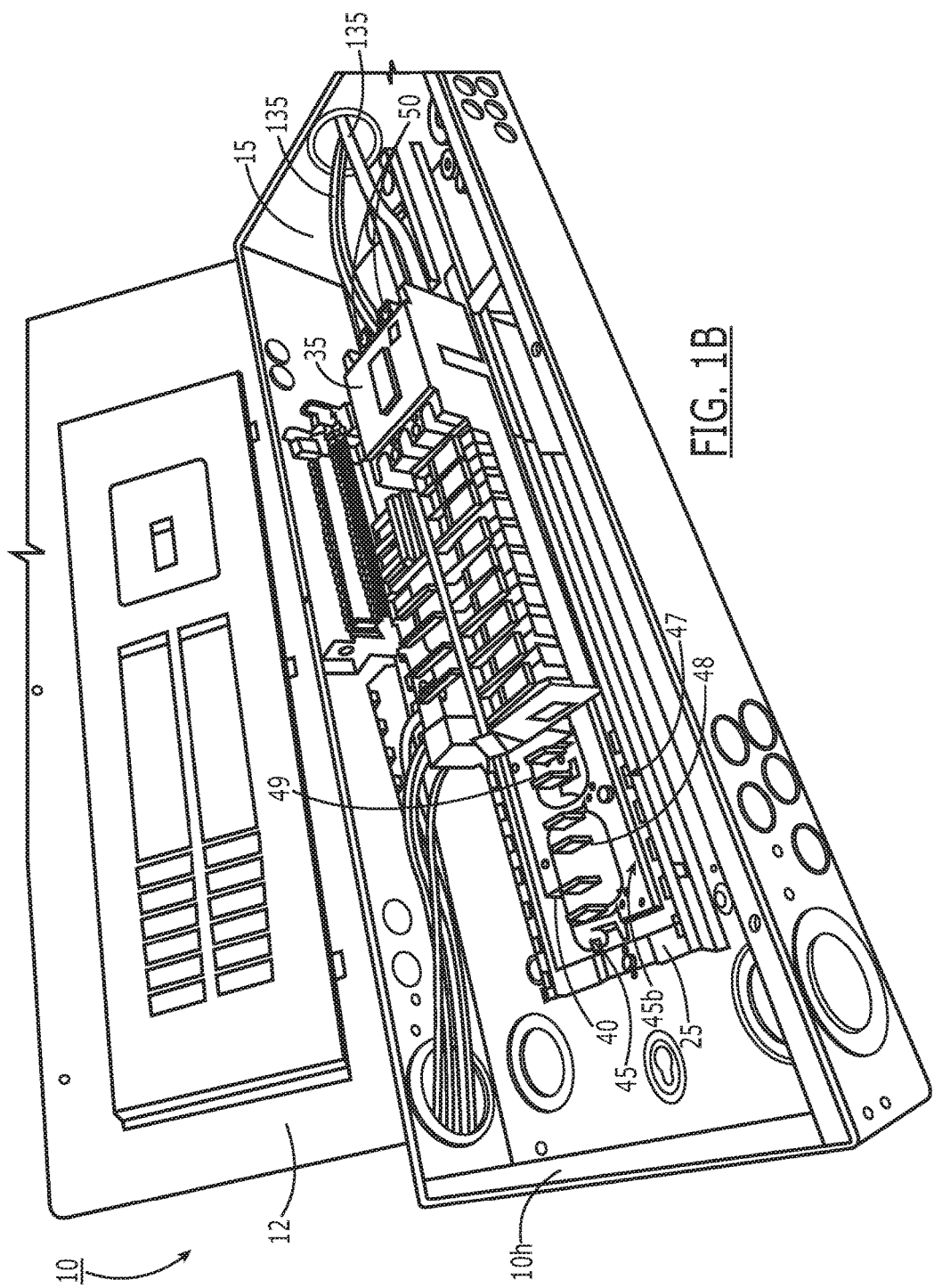
FIG. 1B is a side perspective view of the load center shown in FIG. 1A in an open position according to embodiments of the present invention.

Referring now to FIGS. 1A and 1B, an exemplary load center 10 is shown. The load center 10 includes a housing 10h (also known as an "enclosure") and a panel or cover 12. The panel 12 can be removed or opened to reveal an interior compartment 15 of the housing 10h. As shown, the housing 10h holds a back pan 25, a main breaker 35 and an interior assembly 40 with a bus 45 one or more bus bars 45b. The interior assembly 40 can be either detachably or permanently fastened to the back pan 25. The interior assembly 40 (also sometimes just referred to as "the interior") can refer to the internal components of the load center 10 including the insulating barrier, i.e., sheet, film or layer (which can optionally comprise mylar), the bus 45, the retaining clips (the hook part) and the stabs (the bent-up parts) and the like. The interior assembly 40 can include or be connected to the main breaker 35. The main breaker 35 may be connected to an external power supply via collars or lugs that connect cables/power cords 135.

Referring to FIGS. 1B, 2A and 2B, the one or more bus bars 45b may be a plurality of bus bars 45b and may have substantially flat portions that extend longitudinally within, and lie in a plane parallel to a trough formed by the back pan 25. The bus bars 45b may contain stabs 48, such as branch circuit breaker stabs, that can be exposed within an insulation element so as to conduct electricity to branch circuit breakers 55 (FIG. 2B), when connected. The stabs 48 may extend upwardly to contact desired components such as a branch circuit breaker 55 (FIG. 2B) when connected.

The one or more bus bars 45b can be designed to electrically couple to the main breaker 35 as well any branch circuit breakers 55 (FIG. 2B). The one or more bus bars 45b can remain electrically insulated from other electrically conducting elements thus avoiding the occurrence of a shorting event.

Referring to FIGS. 2A and 2B, the interior assembly 40 may comprise either electrically conducting or electrically insulating (i.e., non-electrically conducting) material adjacent the back pan 25. In some embodiments, an electrically insulating barrier 149, such as a polyester sheet or film which may comprise a mylar or BoPET (biaxially-oriented polyethylene terephthalate) sheet or film, may be provided under and/or on the substantially flat surfaces of the bus bars 45b to electrically insulate the one or more bus bars 45b from other conducting elements, such as the back pan 25, if the back pan 25 is made of a conductive material such as metal.

In some embodiments, the one or more bus bars 45b can maintain electrical insulation from other conducting elements based only on physical separation from the other conducting elements without requiring electrically insulating material.

In some embodiments, if the back pan 25 comprises an electrically insulating material such as a ceramic, polymer and/or plastic, the bus bars 45b do not need to be physically separated from the back pan 25.

In some embodiments, the interior assembly 40 can include retainer clips 47 and insulators 49 as also shown in FIGS. 1B, 2A and 2B. The back pan 25 can have an extension 25e that extends beyond the primary circuit breaker housing 35h on a side away from the branch breaker 55.

In some particular embodiments, the main circuit breaker 35 can be a 200 A, three phase breaker attached to three wires or cables 135, which may be 160 A per cable/cord and may have a diameter of about 0.56 inches. The branch circuit breaker 55 can have a lower amperage rating and smaller diameter wires/cables 155, such as 80 A/phase and may have a diameter of about 0.40 inches.

The main circuit breaker 35 can have any suitable configuration. While not conventional, the main circuit breaker can optionally be an Arc Fault Circuit Interrupter (AFCI) and/or Ground Fault Circuit Interrupter (GFCI) which are among a variety of overcurrent protection devices used for circuit protection and isolation. AFCIs reduce fire hazards in electrical circuits by reducing the effects of high current arcing faults as well as detecting persistent low-current arcing faults. GFCIs reduce the potential of electrical shock. Both branch feeder and combination AFCIs provide conventional thermal and magnetic overcurrent protection. Both can also provide high current or "parallel" arcing fault detection and fire mitigation for installed wiring and connected cords. National Electrical Code (NEC) revisions have increased the requirement for sections of the home that require Arc Fault or Ground Fault protection. Optionally, the circuit breaker can be a Type BR or CH AFCI or GFCI breaker.

Figure 3:
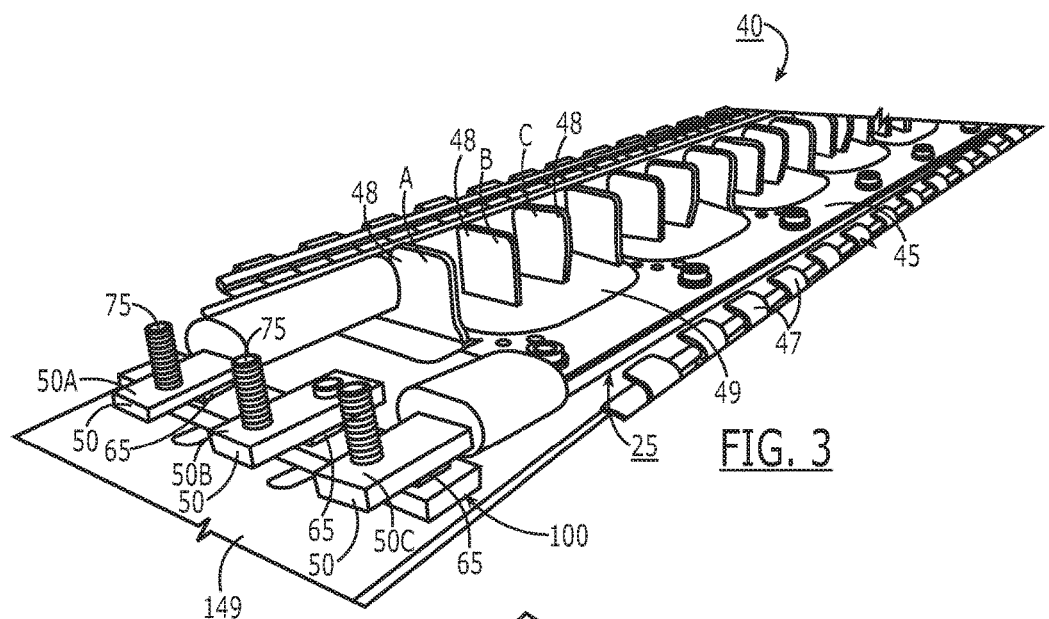
FIG. 3 is an enlarged partial end view of an interior assembly showing a bus with a flexible thermally conductive assembly connected to the bus terminals according to embodiments of the present invention.
Figure 4:
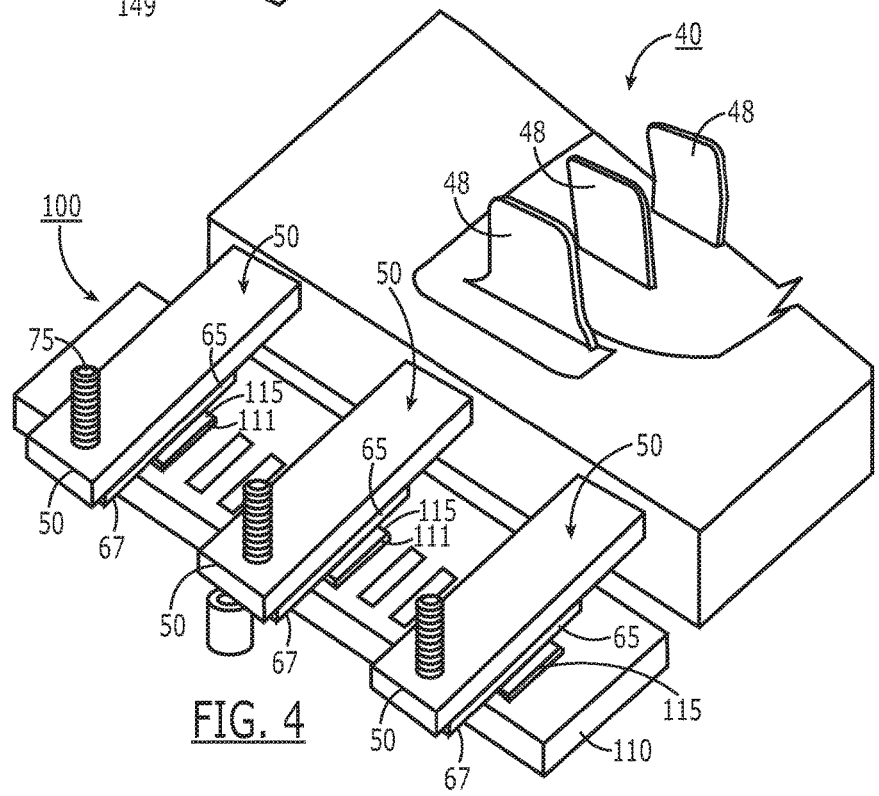
FIG. 4 is a top schematic illustration of the interior assembly showing the load terminals with the thermally conductive assembly according to embodiments of the present invention.

As shown in FIGS. 2A, 3 and 4, the interior 40 can include at least one bus terminal 50 attached to a respective threaded stud 75 that engages the circuit breaker 35 and a thermally conductive assembly 100 that includes at least one thermally conductive first block 115 for each bus terminal 50 that provides a thermal conduction path to a target region such as a heat sink in the interior 40, typically to the back pan 25. The first blocks 115 can also be referred to as "heat sink wedge blocks". In the embodiment shown for the load center 10, the thermally conductive assembly 100 is also electrically resistive (electrically insulating) as will be discussed further below. The bus terminals 50 can include a plurality, shown as three, terminals 50A, 50B, 50C, for three phases (a three pole configuration) such as phase A, B and C of corresponding stabs 48 as shown.

Referring now to FIGS. 4-8, the thermally conductive assembly 100 contacts thermally conductive, and for the load center embodiment, also electrically conductive, second blocks 65, at least one each attached to a respective bus terminal 50. Aligned pairs of first and second blocks 115, 65 contact when installed to provide a thermal conduction interface. The second block 65 can comprise one or more of copper, a copper alloy, aluminum, aluminum alloy or other suitably thermally and electrically conductive material. The second blocks 65 can have increased electrical and thermal conductivity relative to the first blocks 115. The first and second blocks 65, 115 can have any suitable perimeter shape, shown as having a primary body with a perimeter shape that is polygonal. However, circular, oval or other shapes may be used.

Figure 5:
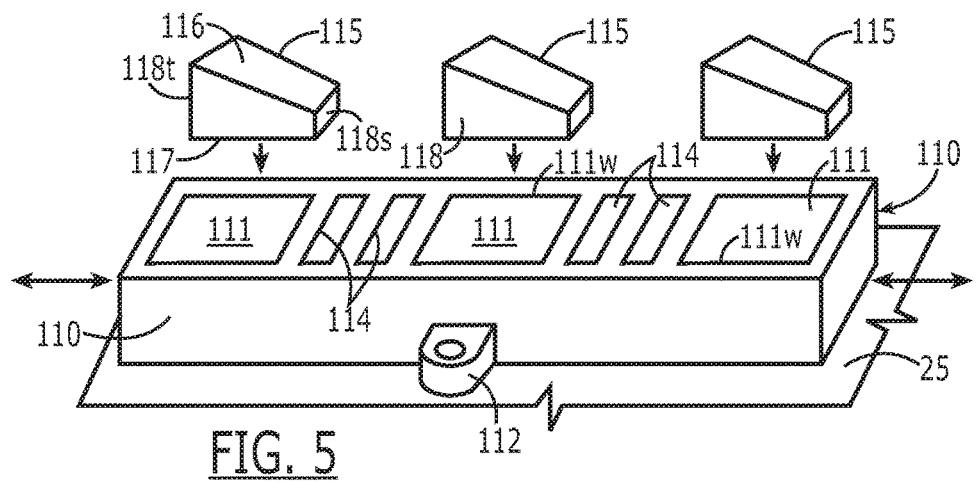
FIG. 5 is an exploded view of a portion of the thermally conductive assembly according to embodiments of the present invention.
Figure 10A:
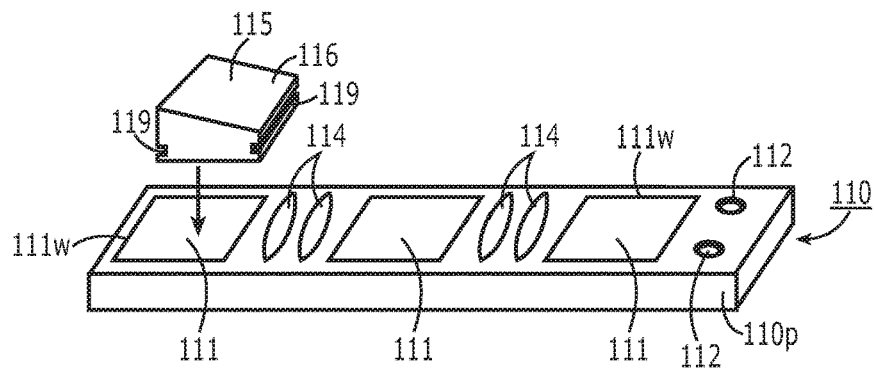
FIG. 10A is a front perspective, partial assembly view of the thermal assembly according to embodiments of the present invention.

It is noted that while shown in FIGS. 4, 5 and 10A, as comprising three blocks 115, the thermally conductive assembly 100 may be provided as a single first block 115 and a smaller housing 110 with a single receptacle 111 or dual with dual receptacles 111 for other embodiments. Also, while it is contemplated that a single pair of cooperating blocks 65, 115 is suitable for a single bus terminal interface or other connection, multiple pairs of longitudinally but closely spaced apart blocks 65, 115 for a single bus terminal interface or other desired interface may be useful for some embodiments (not shown).

The first block 115 can have a planar side 117 (shown as the bottom) and an opposing side as an inclined plane 116 (shown as the top). The block 115 can have a plurality of (shown as four) sidewalls 118 extending between the planar side 117 and the angled side 116, including two that taper from a tall side 118t to a short side 118s.

Figure 10B:
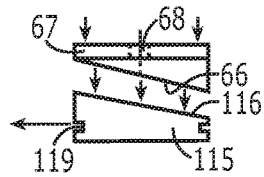
FIG. 10B is a side view of a thermal block of the thermal assembly aligned with a cavity of the housing in FIG. 10A.
Figure 10C:
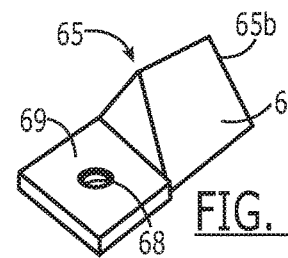
FIG. 10C is a side perspective view of the cooperating electrically conductive block shown as the upper block in FIG. 10B according to embodiments of the present invention.

The first and second cooperating blocks 115, 65 can have contacting angled (sloped) surfaces 66, 116 as shown in FIGS. 5, 6, 7 and 10B, for example. The second block 65 is oriented with its angled surface 66 facing the angled surface 116 of the first block 115 (FIG. 10B).

Figures 6, 7, 8:
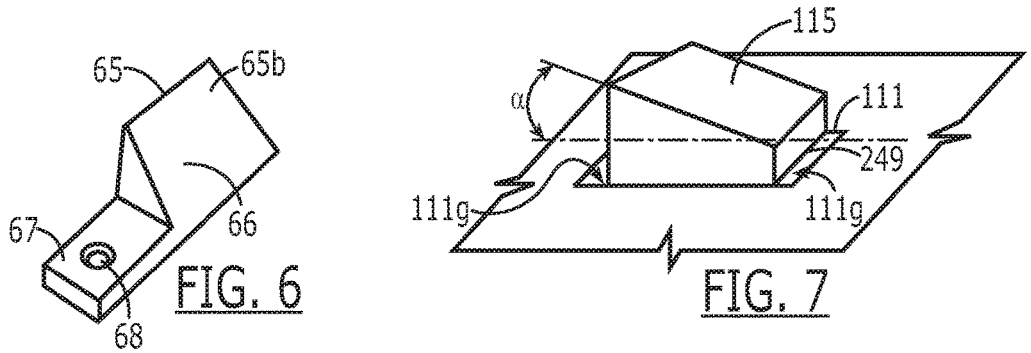
FIG. 6 is a side perspective view of an exemplary electrically and thermally conductive block that can engage the thermally conductive assembly according to embodiments of the present invention.
FIG. 7 is a side perspective view of an exemplary thermally conductive and electrically resistive block of the thermally conductive assembly according to embodiments of the present invention.
FIG. 8 is a partial view of a bus terminal attached to the conductive block shown in FIG. 6 according to embodiments of the present invention.

The inclined plane side or surface 116 can have an angle of inclination "α" measured from horizontal, that is in a range of about 15 degrees to about 75 degrees, more typically between about 30-75 degrees, inclusive thereof, as shown in FIG. 7, for example. The angled side 66 of the second block 65 can have an angle of inclination that is the same as that of the first block 115 but is oriented to face the angled surface 116 of the first block 115. When oriented such that the angled surfaces 66, 116 face each other (FIG. 10B), each wedge angle can angle downward across a lateral extent, shown in a left to right direction, with the second block 65 having its maximal height at the right side and the first block 115 having its maximal height at the left side.

The bottom 117 of the block 115 can be planar and can contact the back pan 25 (FIGS. 3, 5). The opposing angled surface 116 can slidably engage the block 65. The second block 65 can be attached to the bus terminal 50. The second block 65 can be affixed to the bus terminal 50 via fixation device 75 and can be stationary while the first block 115 can slidably engage the second block 65 and slide laterally in response to tightening of the main breaker 35 which causes an interference fit with the second block 65 which, in turn, can push the first block 115 laterally (shown in FIG. 10B as to the left) while maintaining a constant physical contact and a thermal conductivity path.

The second block 65 can have a primary body 65b with the angled surface 66 and a flat extension 67 with an aperture 68 that can receive the fixation member 75, typically an attachment stud 75, to attach to the bus terminal 50. The second block 65 can reside under the bus terminal 50 with the primary body 65b closer to the stabs 48 than the extension 67. The extension 67 can be under and parallel to the bus terminal 50 as shown in FIG. 8.

The aperture 68 can be laterally centered with respect to the flat extension 67 and the primary body 65b and can be longitudinally spaced apart from the primary body with the angled surface 66.

As shown in FIGS. 3, 4, 5 and 10A, the thermally conductive assembly 100 can include at least one housing 110 with at least one receptacle 111, shown as a single unitary, monolithic housing with spaced apart receptacles 111. The housing 110 can comprise a rubber, polymer and/or elastomer. The housing 110 can have an outer perimeter 110p that is rectangular, with a lateral extent greater than a longitudinal extent in the orientation shown for the load center 10, but other shapes may be used. The housing 110 can include one more mount features 112 (FIGS. 5, 10A) for fixation in a desired position.

The receptacles 111 can be totally open in its depth/thickness direction and hold respective first blocks 115 that when installed provide a positive constant contact interface between the second blocks 65 on one side and the back pan 25 or other desired component such as the insulation barrier 149 or metal panel or layer on another end/side for conduction of heat that does not require thermally conductive greases, adhesives or RTVs (Room Temperature Vulcanization silicone) to bridge air gaps. The receptacles 111 are shown as rectangular or square but other shapes can be used such as other polygonal shapes, or oval, circular, or other shapes.

The housing 110 can be sufficiently flexible so that the wall 111w surrounding the receptacle 111 can flex or expand in response to lateral movement of the block 115 held therein. The wall 111w of the housing 110 surrounding a respective receptacle 111 can be independently flexible relative to other walls of other receptacles and can expand and/or deform laterally in a direction orthogonal to the bus terminals.

The first block(s) 115 can be thermally conductive and heat resistant. The term "heat resistant" means that the device can withstand normal operating temperatures of the device for which it is used without undue deterioration so as to be able to function as a heat transfer component and provide the desired constant contact interface. For use with circuit breakers and/or load centers, the term "heat resistant" refers to temperatures of 65 degrees Celsius or greater. The first block 115 can be heat resistant and able to function as a heat transfer component, retain its shape and provide the desired constant contact interface.

The term "thermally conductive" and derivatives thereof with respect to the first block 115 means that it can conduct heat at a suitable level. In some embodiments, the thermal conductivity is in a range of between about 40%-80% of that same shaped and sized element if made of copper or aluminum measured at 20 degrees Celsius. The thermal conductivity of the at least one first block 115 can be above 50 W/m-K*(e.g., W/m, ° K) and typically below about 205 W/m-K*, in some embodiments, while being electrically resistive/electrically insulating. The first block 115 can have a thermal conductivity between about 100 to about 121 W/m-K* (compared to aluminum which is 205 W/m-K* or copper which is higher at 385 W/m-K*) and can also be electrically resistive.

With respect to the housing 110 and the at least one first block 115, the term "electrically resistive" and derivatives thereof refers to the parameter ρ (Ω·m) at 20° C. and is used interchangeably with "electrically insulating" and means that the material/device conducts electricity at a value that is at least less than 50%, typically less than 75%, than that of the cooperating second block 65. The housing 110 and at least one block 115 can have an electrical resistivity ρ (Ω·m) at 20° C. similar to wood or rubber, i.e., at least about $1 \times 10^3$ or about $1\text{-}100 \times 10^3$ or greater. The housing 110 can also be heat resistive.

Figure 9A:
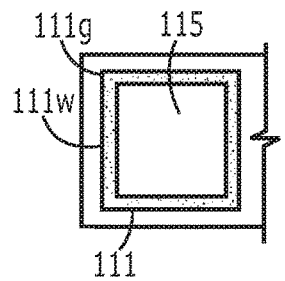
Figure 9B:
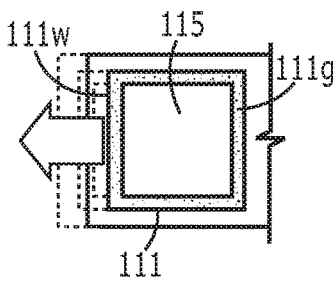
FIG. 9B illustrates a post-installation configuration, allowing the wall of the cavity to expand in response to movement of the thermal block according to embodiments of the present invention.

As shown in FIG. 9A, in position, at least one side of the inner surface of the wall 111w of a respective receptacle 111 of the housing 110 can abut an outer surface of the block 115. As shown in FIG. 9B, the first block 115 can slide left, pushing the wall 111w laterally outward and potentially forming a small gap spaces 111g in the other side of the receptacle. The receptacles 111 can be sized and configured to provide a gap in the left side 111g (FIG. 9A) or the receptacle 111 may be configured to contact a respective block 115 on all sides in the first configuration before the second block 65 engages the first block 115 and pushes the first block 115 laterally (FIG. 9B), typically due to an interference fit of the second block 65 that slidably pushes the angled slide surface 116 laterally.

FIG. 7 illustrates that the receptacle 111 can have first and second gap spaces 111g with the block 115 therebetween to facilitate movement of the block 115 while held therein. The gap spaces 111g can be relatively small, such as in a range of about 0.1 inch and about 0.2 inches. The sliding movement of the block 115 allowed during installation while held inside a receptacle 111 is typically in a range of 0.1 inches and 0.25 inches.

As shown in FIGS. 7, 12A, 12B and 13, for example, the first block 115, 115' can include at least one insulation barrier member 249, such as a mylar barrier member, that can reside tightly against the first block 115' and extend laterally outward therefrom to cover any gaps 111g, that may extend to grounded metal. FIGS. 10A and 10B illustrate that the block 115 can include an attachment feature 119 such as, but not limited to, a slot that engages the barrier member 249.

FIGS. 5 and 10A illustrate that the housing 110 can optionally include a plurality of expansion slits or slots 114 between neighboring receptacles 111 to increase the flexibility of the housing 110 and/or facilitate the expandability/compressibility of the housing 110. The slots 114 may be filled with insulating materials or may be partially or totally open in a depth dimension.

The housing 110 can have reduced thermal conductivity relative to the at least one inner member 115.

The housing 110 can have a constant height about its perimeter or may vary to have longer and shorter sections, for example.

The at least one first block 115 can be in shaped solid blocks of material that is heat resistant, has high thermal conductivity and electrical resistivity. The at least one first block 115 can have a height that is between 0.1-2 inches, in some embodiments. In some embodiments, the height can be between 0.5 and one inch, such as about 0.58 inches, the width and length can be greater than the height by about 50%-100%. The width and length can be the same. The width and length may be about 0.75 inches.

The at least one first block 115 can comprise or be formed of boron nitride. Boron nitride has high thermal conductivity and good electrical insulation. Other suitable, thermally conductive materials may be used for the first block 115. Where more than one first block 115 is used, they can comprise the same or different materials or material formulations.

The receptacles of the housing outer member 110. In some embodiments, when unassembled and held in a non-expanded state, the receptacles 111 can have a height that is about the same as the height of a corresponding first block 115 held therein, such as within +/−about 10% of the height of the first block 115. In some embodiments, the height of the receptacle 111 is less than the height of the block 115 held therein. In some embodiments, the height of the receptacle 111 is greater than the height of the block 115 held therein. The receptacle 111 can have a height that is about 0.5 inches to about 1 inch, such as about 0.58 inches, about 0.59 inches and about 0.6 inches, in some embodiments. The wall 111w of the receptacle 111 can be configured to deform or compress in the height dimension. The receptacle 111 can have width and length dimensions that correspond to (i.e., are the same or substantially the same as) the block 115, such as about 0.75 inches, in some embodiments.

The receptacle 111 can increase in size, typically by between 1% to about 10%, in response to sliding movement of the block 115 upon interference-fit with the second block 65 so that the second block 65 has a positive contact with the corresponding first block 115 and the bottom 117 has a positive, constant contact with a desired component such as the back pan 25 once assembled with the circuit breaker 35 tightened to hold the cable 135 in a collar (FIG. 1B). The bottom 117 of the block 115 can be parallel to the primary surface of the back pan 25.

Figure 11:
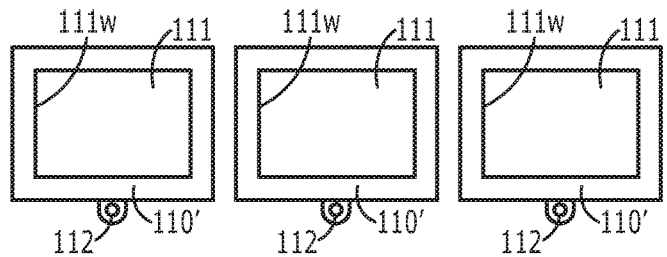
FIG. 11 is a schematic illustration of another embodiment of housings of the thermally conductive assembly according to embodiments of the present invention.

The housing member 110 can be a single housing as shown in FIGS. 4, 5 and 10A, or may be provided as a plurality of spaced apart housings 110' as shown in FIG. 11. Where separate housings are used, they may be connected or remain detached from each other.

Figure 12A:
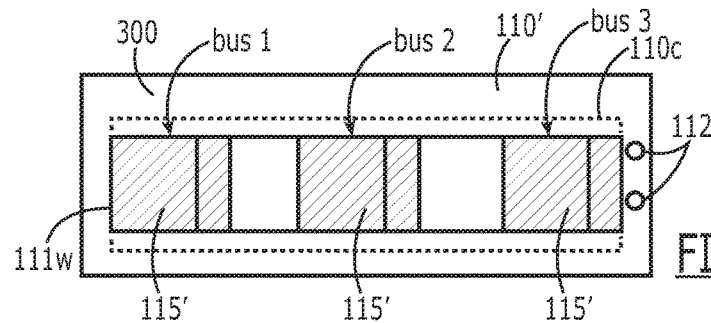
FIG. 12A is a top schematic illustration of another embodiment of the thermally conductive assembly according to embodiments of the present invention.
Figure 12B:
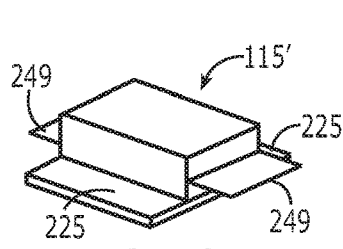
FIG. 12B is a side perspective view of an exemplary thermally conductive block useful for the embodiment of the housing shown in FIG. 12A according to embodiments of the present invention.

FIGS. 12A and 12B illustrate another embodiment of a thermal assembly 100' that allows for the slidable movement of the first blocks 115' relative to the second blocks 65. The housing 110' can include laterally extending channels 110c that slidably engage arms 225 of the first block 115'. The housing 110' provides the retainer and alignment while allowing the appropriate slidable engagement to maintain the constant, positive contact and thermal connection/interface between the pairs of blocks 65, 115'. The first blocks 115' can each include insulating barrier members 249 that extend laterally outward from opposing right and left sides.

Figure 13:
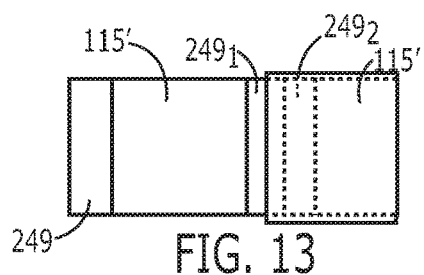
FIG. 13 is a top schematic illustration of thermal blocks with insulating barrier members according to embodiments of the present invention.

As shown in FIG. 13, different neighboring blocks 115' can have the insulating barrier members 249 at different heights so that a first insulating barrier member $249_1$ can reside above another (second) insulating barrier member $249_2$ in the housing 110' (FIG. 12A) and allow for one to slide beneath another to prevent gaps to protect phase to ground.

It is also noted that the thermally conductive assembly 100, 100' may be useful for other devices where a heat conduction path is desired, including, by way of example, from conductors inside circuit breakers and/or for Motor Control Centers or buckets thereof, motor starters or feeders, switchgears and the like. See, e.g., U.S. Pat. No. 4,024,441, U.S. Patent Application Publication Serial Number US 2013/0077210, U.S. Pat. Nos. 6,194,983 and 7,186,933, the contents of which are hereby incorporated by reference as if recited in full herein.

It is further noted, that the thermally conductive assembly 100, 100' can be configured to cooperate with other conductive members to facilitate heat conduction and is not limited to bus terminals.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

That which is claimed is:

1. A thermally conductive assembly comprising:
   at least one first wedge block, wherein the at least one first wedge block is thermally conductive and has an outer surface with an inclined plane;
   a housing having at least one receptacle defining an open channel that holds the at least one first wedge block with the inclined plane residing external to the housing; and
   at least one second wedge block, each of the at least one second wedge block comprising a respective inclined plane that faces the inclined plane of an aligned one of the at least one first wedge block, wherein, at 20 degrees Celsius, the at least one first wedge block conducts electricity at a value that is less than 50% that of the at least one second wedge block.

2. The assembly of claim 1, wherein the at least one first wedge block is a plurality of first wedge blocks, each having a respective inclined plane with an angle of inclination in a range of about 35-75 degrees, and wherein, measured at 20 degrees Celsius, the at least one first wedge block has a thermal conductivity in a range of about 50 W/m-K* to about 205 W/m-K*.

3. The assembly of claim 1, wherein the housing is electrically resistive, and wherein the at least one receptacle has a wall that is sufficiently flexible to be able to expand outward in response to an outward force applied by the at least one first wedge block.

4. The assembly of claim 1, wherein the at least one first wedge block is a plurality of spaced apart first wedge blocks, and wherein the plurality of first wedge blocks have an electrical resistivity $\rho$ ($\Omega \cdot$m) at 20 degrees Celsius of at least about $1 \times 10^3$ or about $1\text{-}100 \times 10^{13}$ or greater.

5. A thermally conductive assembly comprising:
   at least one first wedge block, wherein the at least one first wedge block is thermally conductive and has an outer surface with an inclined plane; and
   a housing having at least one receptacle that holds the at least one first wedge block with the inclined plane residing external to the housing,
   wherein the housing is rectangular, wherein the at least one receptacle is a plurality of spaced apart but adjacent receptacles, wherein the at least one first wedge block is a plurality of first wedge blocks, one in each of the receptacles, and wherein the first wedge blocks cooperate with the housing and, in use, each first wedge block can slidably move in a respective receptacle upon contact with a matable second wedge block.

6. The assembly of claim 1, wherein the at least one first wedge block comprises boron nitride.

7. The assembly of claim 1, wherein the at least one receptacle is a plurality of spaced apart receptacles that are vertically or horizontally aligned, and wherein the at least one first wedge block is a plurality of first wedge blocks with a planar bottom surface that opposes an outer surface thereof with the inclined plane, with one first wedge block in a corresponding one of the receptacles.

8. A thermally conductive assembly comprising:
   at least one first wedge block, wherein the at least one first wedge block is thermally conductive and has an outer surface with an inclined plane;
   a housing having at least one receptacle that holds the at least one first wedge block with the inclined plane residing external to the housing; and
   at least one second wedge block comprising a respective inclined plane that faces the inclined plane of an aligned one of the at least one first wedge block, wherein the at least one second wedge block is electrically conductive and thermally conductive, and wherein the at least one second wedge block comprises a planar extension that projects outwardly a distance from the inclined plane of the second wedge block and comprises an aperture configured to receive a fixation member.

9. A thermally conductive assembly comprising:
at least one first wedge block, wherein the at least one first wedge block is thermally conductive and has an outer surface with an inclined plane;
a housing having at least one receptacle that holds the at least one first wedge block with the inclined plane residing external to the housing; and
at least one second wedge block comprising a respective inclined plane that faces the inclined plane of an aligned one of the at least one first wedge block,
wherein the at least one second wedge block comprises copper or aluminum, and wherein the at least one first wedge block comprises boron nitride.

10. A load center comprising:
an enclosure having an interior compartment;
a heat sink member in the interior compartment;
one or more bus bars attached to one or more bus terminals in the interior compartment;
a circuit breaker in the interior compartment electrically engaged with the one or more bus bars;
at least one first wedge block in the interior compartment thermally coupled to the heat sink member, wherein the at least one first wedge block is thermally conductive; and
at least one second wedge block thermally coupled to the one or more bus bars and cooperatively engaged with the at least one first wedge block,
wherein the at least one first wedge block and the at least one second wedge block each comprise an inclined plane, and wherein the inclined planes of pairs of the at least one first and second wedge blocks face each other.

11. A load center comprising:
an enclosure having an interior compartment;
a heat sink member in the interior compartment;
one or more bus bars attached to one or more bus terminals in the interior compartment;
a circuit breaker in the interior compartment electrically engaged with the one or more bus bars;
at least one first wedge block in the interior compartment thermally coupled to the heat sink member, wherein the at least one first wedge block is thermally conductive; and
at least one second wedge block thermally coupled to the one or more bus bars and cooperatively engaged with the at least one first wedge block,
wherein the at least one first wedge block is held in a wedge block housing that has at least one receptacle with a wall that is sufficiently flexible to be able to expand in response to sliding movement of the at least one first wedge block relative to the second wedge block as the circuit breaker is tightened into position.

12. The load center of claim 10, wherein the at least one first wedge block is a plurality of first wedge blocks, the load center further comprising a wedge block housing that comprises a plurality of spaced apart receptacles holding respective first wedge blocks of the plurality of first wedge blocks.

13. The load center of claim 10, wherein the at least one second wedge block is attached to the one or more bus terminals, wherein the at least one second wedge block comprises copper or aluminum, and wherein the at least one first wedge block comprises boron nitride.

14. The load center of claim 10, wherein the at least one first wedge block is a plurality of first wedge blocks, each having an inclined plane having an angle of inclination in a range of 35-75 degrees, and wherein the plurality of the first wedge blocks are electrically resistive.

15. The load center of claim 10, wherein the at least one first wedge block comprises boron nitride.

16. A load center comprising:
an enclosure having an interior compartment;
a heat sink member in the interior compartment;
one or more bus bars attached to one or more bus terminals in the interior compartment;
a circuit breaker in the interior compartment electrically engaged with the one or more bus bars;
at least one first wedge block in the interior compartment thermally coupled to the heat sink member, wherein the at least one first wedge block is thermally conductive; and
at least one second wedge block thermally coupled to the one or more bus bars and cooperatively engaged with the at least one first wedge block,
wherein the at least one second wedge block is electrically conductive and thermally conductive, and wherein the at least one second wedge block comprises a planar extension that projects outwardly a distance from a body portion with an inclined plane, wherein the planar extension comprises an aperture, and wherein the load center further comprises a fixation member extending through the aperture and attached to a respective one of the one or more bus terminals.

17. A method of installing a heat conduction device to an electrical device, comprising:
providing at least one first wedge block, wherein the at least one first wedge block is thermally conductive, and wherein the at least one wedge block is held in an electrically resistive housing having a receptacle with a wall that is flexible to be able to expand laterally;
providing at least one second wedge block, wherein the at least one second wedge block is thermally conductive and electrically conductive;
slidably engaging at least one pair of the at least one first and the at least one second wedge blocks with inclined planes of each pair facing each other; and
providing a heat conduction path between the at least one pair of the at least one first and second wedge blocks.

18. A method of installing a heat conduction device to an electrical device, comprising:
providing at least one first wedge block, wherein the at least one first wedge block is thermally conductive, and wherein the at least one wedge block is held in an electrically resistive housing having a receptacle with a wall that is flexible to be able to expand laterally;
providing at least one second wedge block, wherein the at least one second wedge block is thermally conductive and electrically conductive;
slidably engaging at least one pair of the at least one first and the at least one second wedge blocks with inclined planes of each pair facing each other; and
providing a heat conduction path between the at least one pair of the at least one first and second wedge blocks,
wherein the at least one first wedge block and the at least one second wedge block are each pluralities, and wherein the at least one pair comprises first, second and third pairs of the first and second wedge blocks, the method further comprising:

tightening a connection to a circuit breaker using a fixation member extending through the at least one second wedge block;
creating an interference fit between the pairs of wedge blocks in response to the tightening; and
sliding the first wedge block of the pairs of first and second wedge blocks based on the created interference fit while maintaining positive contact between the first, second and third pairs of first and second wedge blocks to provide the heat conduction path,
wherein the first wedge blocks comprise boron nitride and the second wedge blocks comprise copper or aluminum, and wherein the pairs are held in a load center and the heat conduction path is between bus bar terminals and a heat sink member of a back pan and/or metal panel through the first, second and third pairs of the first and second wedge blocks.

19. The method of claim 17, wherein the at least one first wedge block comprises boron nitride and the at least one second wedge block comprises copper or aluminum.

* * * * *